US008378645B2

(12) United States Patent
Hobelsberger et al.

(10) Patent No.: US 8,378,645 B2
(45) Date of Patent: Feb. 19, 2013

(54) METHOD FOR MONITORING AN ELECTRODYNAMIC MACHINE

(75) Inventors: Max Hobelsberger, Wuerenlingen (CH); Bernhard Mark, Waldshut (DE)

(73) Assignee: Alstom Technology Ltd, Baden (CH)

( * ) Notice: Subject to any disclaimer, the term of this patent is extended or adjusted under 35 U.S.C. 154(b) by 21 days.

(21) Appl. No.: 12/902,346

(22) Filed: Oct. 12, 2010

(65) Prior Publication Data

US 2011/0084671 A1    Apr. 14, 2011

Related U.S. Application Data

(63) Continuation of application No. PCT/EP2009/053892, filed on Apr. 1, 2009.

(30) Foreign Application Priority Data

Apr. 15, 2008  (CH) .................................... 0582/08

(51) Int. Cl.
*H02K 11/00* (2006.01)

(52) U.S. Cl. ........................................................ 322/99

(58) Field of Classification Search ...................... 322/99
See application file for complete search history.

(56) References Cited

U.S. PATENT DOCUMENTS

| | | | | | |
|---|---|---|---|---|---|
| 3,367,194 | A | * | 2/1968 | Diamantides | 74/5.6 A |
| 3,388,305 | A | * | 6/1968 | Smith | 318/707 |
| 3,495,447 | A | * | 2/1970 | Conniff et al. | 73/773 |
| 3,506,914 | A | | 4/1970 | Albright et al. | 324/546 |
| 3,885,420 | A | | 5/1975 | Wolfinger | 73/650 |
| 3,934,459 | A | | 1/1976 | Wolfinger et al. | 73/650 |
| 3,999,115 | A | * | 12/1976 | South et al. | 322/25 |
| 4,080,559 | A | * | 3/1978 | Wright et al. | 322/58 |
| 4,114,960 | A | * | 9/1978 | Habermann et al. | 310/90.5 |
| 4,137,780 | A | | 2/1979 | Wolfinger | 73/650 |
| 4,148,222 | A | | 4/1979 | Wolfinger | 73/650 |
| 4,167,691 | A | * | 9/1979 | Sorensen et al. | 318/400.37 |
| 4,302,715 | A | * | 11/1981 | Putman et al. | 323/210 |
| 4,317,371 | A | | 3/1982 | Wolfinger | 73/650 |
| 4,352,293 | A | * | 10/1982 | Kurihara et al. | 73/593 |
| 4,387,297 | A | * | 6/1983 | Swartz et al. | 235/462.21 |
| 4,444,064 | A | | 4/1984 | Wolfinger | 73/862.326 |
| 4,496,831 | A | * | 1/1985 | Swartz et al. | 235/472.01 |
| 4,563,643 | A | * | 1/1986 | Leschek et al. | 324/207.16 |
| 4,593,186 | A | * | 6/1986 | Swartz et al. | 235/462.36 |
| 4,607,217 | A | | 8/1986 | Bhargava | 324/76.39 |
| 4,785,242 | A | * | 11/1988 | Vaidya et al. | 324/207.25 |
| 4,793,186 | A | | 12/1988 | Hurley | 73/650 |
| 4,862,506 | A | * | 8/1989 | Landgarten et al. | 381/71.2 |
| 5,036,236 | A | * | 7/1991 | Wilson | 310/90.5 |
| 5,280,163 | A | * | 1/1994 | Barkan | 235/462.36 |
| 5,572,119 | A | * | 11/1996 | Taylor | 324/207.16 |

(Continued)

FOREIGN PATENT DOCUMENTS

DE   197 28 959 A1   1/1999
EP   1 537 390 B     1/2008

(Continued)

*Primary Examiner* — Pedro J Cuevas

(74) *Attorney, Agent, or Firm* — Leydig, Voit & Mayer, Ltd.

(57) ABSTRACT

A method for monitoring an electrodynamic machine a stator and a rotor arrangement mounted along a rotatable shaft. The rotor arrangement is disposed within the stator and forms an air gap between the rotor arrangement and the stator. At least one sensor is disposed in the air gap and/or within the stator. Measurement signals are detected that are dependent on a magnetic field produced by the electrodynamic machine. The measurement signals are used as a basis for detecting oscillations of the shaft.

21 Claims, 2 Drawing Sheets

U.S. PATENT DOCUMENTS

| | | | | |
|---|---|---|---|---|
| 5,613,259 | A * | 3/1997 | Craft et al. | 15/22.1 |
| 5,726,520 | A * | 3/1998 | Grahn | 310/328 |
| 6,362,581 | B1 * | 3/2002 | Matsushiro et al. | 318/400.11 |
| 6,771,065 | B2 * | 8/2004 | Pointer | 324/207.2 |
| 6,778,063 | B1 * | 8/2004 | Chen | 338/162 |
| 6,882,173 | B1 * | 4/2005 | Nelson et al. | 324/765.01 |
| 6,891,283 | B2 * | 5/2005 | Fukumoto et al. | 307/10.1 |
| 7,004,724 | B2 * | 2/2006 | Pierce et al. | 416/61 |
| 7,102,379 | B2 * | 9/2006 | Hobelsberger et al. | 324/765.01 |
| 7,117,744 | B2 * | 10/2006 | Hobelsberger et al. | 73/660 |
| 7,212,010 | B2 * | 5/2007 | Hobelsberger | 324/545 |
| 7,322,794 | B2 * | 1/2008 | LeMieux et al. | 416/40 |
| 7,411,404 | B2 * | 8/2008 | Rai | 324/510 |
| 7,501,782 | B2 * | 3/2009 | Buhler et al. | 318/607 |
| 7,649,470 | B2 * | 1/2010 | Hobelsberger et al. | 340/679 |
| 7,705,623 | B2 * | 4/2010 | Hobelsberger | 324/765.01 |
| 7,855,469 | B2 * | 12/2010 | Stegemann et al. | 290/55 |
| 7,888,915 | B2 * | 2/2011 | Zhao et al. | 322/47 |
| RE42,197 | E * | 3/2011 | Noell | 73/593 |
| 7,939,956 | B1 * | 5/2011 | Larsen | 290/44 |
| 8,099,255 | B2 * | 1/2012 | Madge | 702/150 |
| 2002/0021098 | A1 * | 2/2002 | Matsushiro et al. | 318/254 |
| 2002/0118010 | A1 * | 8/2002 | Pointer | 324/207.2 |
| 2003/0011252 | A1 * | 1/2003 | Langberg | 310/36 |
| 2003/0127273 | A1 * | 7/2003 | Fukumoto et al. | 180/400 |
| 2004/0151575 | A1 * | 8/2004 | Pierce et al. | 415/1 |
| 2005/0068058 | A1 * | 3/2005 | Nelson et al. | 324/772 |
| 2005/0183504 | A1 * | 8/2005 | Hobelsberger et al. | 73/593 |
| 2005/0184751 | A1 * | 8/2005 | Hobelsberger et al. | 324/772 |
| 2005/0200378 | A1 * | 9/2005 | Hobelsberger et al. | 324/772 |
| 2006/0043977 | A1 * | 3/2006 | Hobelsberger | 324/545 |
| 2006/0070435 | A1 * | 4/2006 | LeMieux et al. | 73/168 |
| 2006/0097597 | A1 * | 5/2006 | Koziel | 310/179 |
| 2006/0244330 | A1 * | 11/2006 | Hill | 310/156.05 |
| 2006/0255664 | A1 * | 11/2006 | Kraus et al. | 310/36 |
| 2007/0296367 | A1 * | 12/2007 | Buhler et al. | 318/607 |
| 2008/0294344 | A1 * | 11/2008 | Sugiura | 702/6 |
| 2010/0019135 | A1 * | 1/2010 | Eckert et al. | 250/231.13 |
| 2010/0026994 | A1 * | 2/2010 | Bove et al. | 356/138 |
| 2010/0133828 | A1 * | 6/2010 | Stegemann et al. | 290/44 |
| 2011/0024146 | A1 * | 2/2011 | Katou et al. | 173/15 |
| 2011/0101813 | A1 * | 5/2011 | Tbatou | 310/156.35 |
| 2011/0234181 | A1 * | 9/2011 | Hobelsberger et al. | 322/99 |

FOREIGN PATENT DOCUMENTS

| | | |
|---|---|---|
| JP | 52110449 A | 9/1977 |
| WO | WO 99/41521 A | 8/1999 |

* cited by examiner

METHOD FOR MONITORING AN ELECTRODYNAMIC MACHINE

CROSS REFERENCE TO RELATED APPLICATIONS

This is a continuation application of International Application No. PCT/EP2009/053892 filed on Apr. 1, 2009, which published as WO 2009/144061 A3 on Dec. 3, 2009, which claims priority to Swiss Patent Application No. CH 00582/08, filed on Apr. 15, 2008, the entirety of which are incorporated by reference herein.

FIELD

The invention relates to a method for monitoring an electrodynamic machine using measurement signals that depend on a magnetic field which is produced by the electrodynamic machine.

BACKGROUND

Electrodynamic machines convert mechanical energy to electrical energy (generator mode) or electrical energy to mechanical energy (electric-motor mode). The conversion is based on the Lorentz force, which acts on moving changes in a magnetic field.

By way of example, but without imposing any restriction, the following text relates to electrodynamic machines which operate as generators. In particular, the statements relate to large-technical installations, for example large synchronous generators, such as those used for industrial electricity generation.

The generator has a rotor which is mounted on a shaft and rotates at a rotor rotation frequency within a stationary stator. During rotation, the rotor produces a revolving magnetic constant field, which induces a sinusoidal electrical voltage, and therefore a sinusoidal current, in the stator windings. The constant field of the rotor is produced by windings through which current flows, and the windings are arranged in slots which run parallel to the rotation axis. In large-technical installations, the windings consist, for example, of hollow metal strips whose outer surfaces are electrically insulated from one another by means of a plastic layer. A cooling medium generally circulates in the interior of the hollow metal strips.

Electrodynamic machines, in particular large generators, are monitored during operation in order in particular to identify vibrations of the shaft or the causes thereof at an early stage, and in order in this way to make it possible to avoid damage to the machine.

The vibrations of the shaft preferably occurs in the form of torsional oscillations, pendulum oscillations and/or bending oscillations as well. Torsional oscillations are oscillations which lead to a non-uniform rotation frequency along the shaft, and therefore to torsion in the shaft. By way of example, they can be caused by sudden load changes. Torsional oscillations are very small oscillations, normally with a phase amplitude in the region of 0.01°, but can nevertheless lead to a very high load on the shaft. The frequencies at which torsional oscillations occur depend on the material character and on the thickness of the shaft, on the masses connected to the shaft, and on the size of the installation.

Pendulum oscillations are quasi-periodically damped changes in the rotation frequency of the shaft about the mains frequency (typically 50 to 60 Hz) which are caused, for example, by disturbances in the form of surges from the mains, and likewise have a torsional effect on the shaft. However, pendulum oscillations typically lead to considerably slower changes in the instantaneous angular velocity at which the shaft rotates, and the instantaneous phase of the rotary movement, than the torsional oscillations which have been mentioned. For example, in the case of a large-technical generator for industrial electrical generation, which has a rated rotor rotation frequency of typically 50 or 60 Hz, torsional oscillations occur at typical frequencies between 100 and 300 Hz, and pendulum oscillations at typical frequencies of 5 to 10 Hz.

Furthermore, vibrations can also be caused by rotor turn shorts or else by non-uniform pole arrangements of the magnetic field produced by the rotor.

In order to protect the electrodynamic machine against damage, it is shut down when major vibrations occur.

U.S. Pat. No. 3,506,914 describes a method by which rotor turn shorts can be detected which, as mentioned above, can lead to vibrations. So-called stray-field measurement is used to detect rotor turn shorts, in that the stray magnetic field which is produced by the rotor and tangentially to the rotor surface with the aid of air-gap sensors, which are fitted between the rotor and the stator in the air gap. This makes use of the fact that turn shorts result in the stray field being modified in a way which can be measured in the air gap.

Another approach to determine shaft oscillations, which is described in various documents, for example U.S. Pat. No. 3,934,459, U.S. Pat. No. 3,885,420, U.S. Pat. No. 4,148,222, U.S. Pat. No. 4,137,780, U.S. Pat. No. 4,317,371, consists in that a toothed wheel is connected to the shaft in order to detect torsional oscillations of the shaft outside the rotor and the stator, which toothed wheel produces periodic measurement signals in one or more circumferential sensors during the rotation of the shaft, with the period depending on the number of teeth and the rotation frequency of the shaft. Torsional oscillations of the shaft result in phase or frequency modulation of the detected signals. However, this procedure has the disadvantage that a tooth wheel must be provided as a signal transmitter. Retrospective installation may be impossible or difficult, and may be associated with correspondingly high costs.

One method for detection of torsional oscillations, described in U.S. Pat. No. 4,444,064, consists in first of all applying a magnetic pattern to the shaft, which acts as a pulse transmitter during operation.

U.S. Pat. No. 4,793,186 describes a measurement instrument for torsion measurement, which is connected to the phase winding terminals of a permanent-magnet generator which is coupled to the shaft of a generator. The torsional oscillations are deduced by evaluation, that is to say by frequency demodulation by means of phase locked loop technology, of the voltages which are produced. The method can be used only for systems with a permanent-magnet generator, and, furthermore, is relatively inaccurate.

A further possible way to detect torsional oscillations along a generator shaft is described in JP 52110449. This is based on the measurement and evaluation of phase terminal currents in the generator. This method is also relatively inaccurate and, furthermore, requires current transformers for relatively high frequencies.

The methods mentioned above relate exclusively to the measurement of torsional oscillations, but not to the detection of bending oscillations.

In contrast, EP 1 537 390 B1 describes a method by means of which not only torsional oscillations but also pendulum and bending oscillations can be detected. For this purpose, shaft currents and/or shaft voltages which occur on the shaft are tapped off and evaluated outside the generator.

SUMMARY

In an embodiment, the present invention provides a method for monitoring an electrodynamic machine a stator and a rotor arrangement mounted along a rotatable shaft. The rotor arrangement is disposed within the stator and forms an air gap between the rotor arrangement and the stator. At least one sensor is disposed in the air gap and/or within the stator. Measurement signals are detected that are dependent on a magnetic field produced by the electrodynamic machine. The measurement signals are used as a basis for detecting oscillations of the shaft.

BRIEF DESCRIPTION OF THE DRAWINGS

Embodiments of the invention are described in detail below with reference to the drawing, in which.

DETAILED DESCRIPTION

Figure 1:
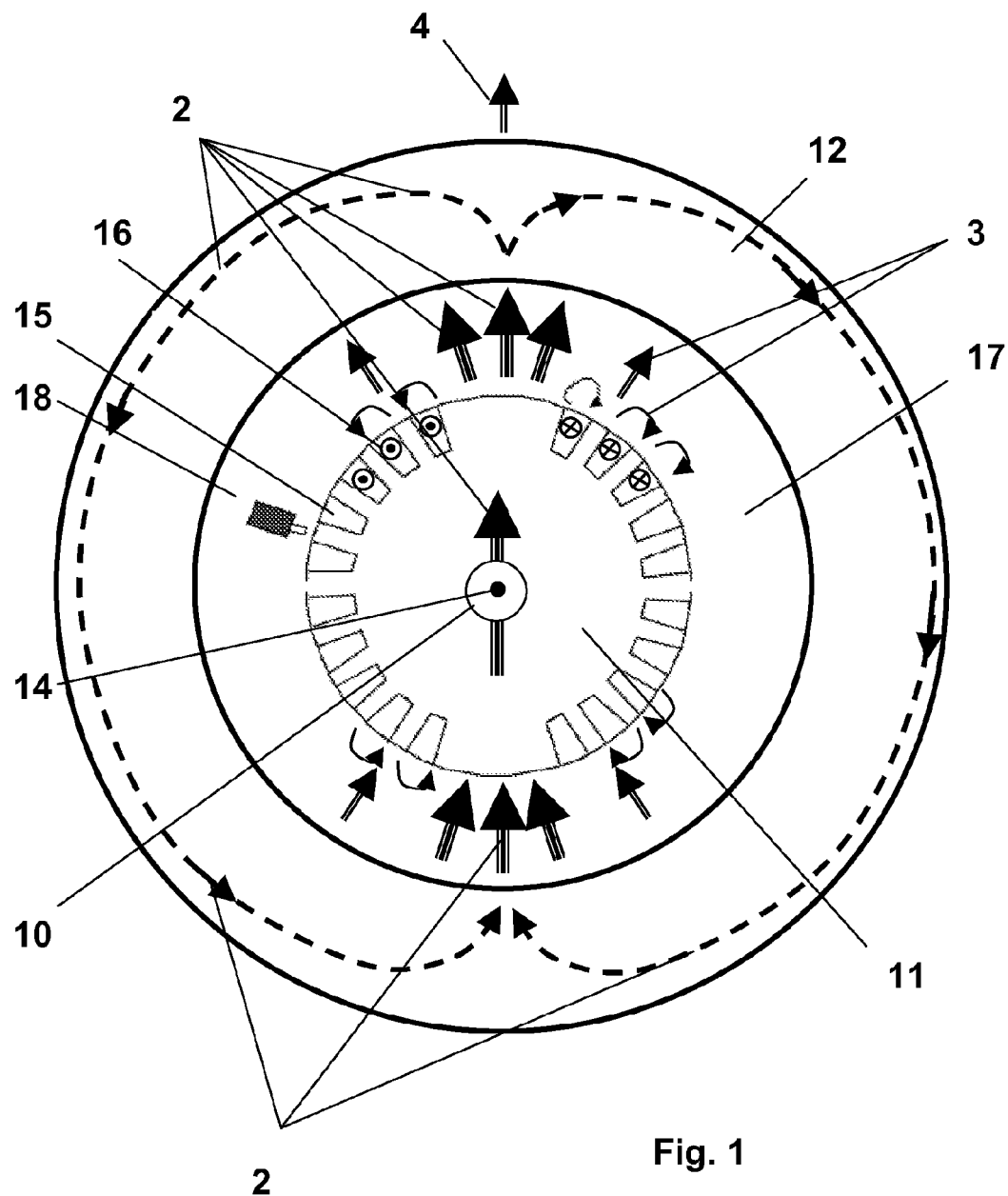
FIG. 1 shows a schematic section through a generator having a sensor fitted within the air gap.

An embodiment of the invention is based on the object of developing a method for monitoring an electrodynamic machine, in particular a generator, so as to allow reliable detection of substantially all oscillation forms which occur along the shaft. Measures which are as cost effective as possible and which can also be retrofitted to generators which are in use are required for this purpose.

According to an embodiment of the invention, the method for monitoring an electrodynamic machine, having a rotor arrangement which is mounted along a rotatable shaft within a stator and encloses an air gap (17) with the stator, in which measurement signals are detected and evaluated by means of at least one sensor, which is arranged within the air gap or within the stator, which measurement signals depend on a magnetic field, which is produced by the electrodynamic machine, is distinguished in that the measurement signals are obtained by means of the sensors, which are arranged in the air gap or within the stator are used as the basis for detection of oscillations of the shaft. In this case, the oscillations are, in particular, torsional oscillations, pendulum oscillations and/or bending oscillations. The measurement signals are appropriately evaluated in a particularly advantageous manner in order to determine the natural frequencies of the shaft oscillation.

A method is particularly preferable, in which the measurement signals to be evaluated are detected by already existing sensors, which are also intended for detection of rotor turn shorts. Sensors such as these preferably detect the tangential and/or radial magnetic field which is produced by the electrodynamic machine in the air gap between the rotor arrangement and the stator. Alternatively or in combination with this, the magnetic main flux is also detected in the laminated stator core. Sensors which are sensitive to magnetic fields and are in the form of a coil, a conductor loop, a Hall sensor or a magnetoresistive measurement sensor are preferably used.

The measurement signals detected by sensors are preferably analyzed in the time domain and/or in the frequency domain, for example by Fourier transformation of measurement signals detected in the time domain, wherein the detected measurement signals are evaluated for phase, frequency and/or amplitude behavior at a rated rotor rotation frequency and/or at a multiple of the rated rotor rotation frequency.

In particular, the detected measurement signals are investigated in respect of frequency, phase, and/or amplitude modulations contained in them. These can be seen in the spectrum as sidelines of the rated rotor rotation frequency or its harmonics, and as a broadening of the spectral lines associated with the rated rotor rotation frequency and its harmonics. The phase or frequency behavior is preferably analyzed by means of demodulation methods known from radio technology. These include both analog methods, for example methods for frequency shifting, or digital methods, for example sampling methods with periodic sampling times.

Known analog or digital methods for amplitude modulation are preferably used for analysis of the amplitude behavior.

Particularly in the case of digital demodulation methods, the detected measurement signals or signals which are derived from them are sampled at a sampling rate which corresponds approximately to the rated rotor rotation frequency or to an integer multiple of this frequency, that is to say a harmonic of it.

The phase or frequency fluctuations of the detected measurement signals at the rated rotor rotation frequency and/or the multiples of the rated rotor rotation frequency are preferably determined with respect to a respective reference phase or reference frequency profile. The phase or frequency fluctuations of the detected measurement signals are then used as the basis for assessment of the rotor rotational movement at the rated rotor rotation frequency and are used as a measure for the development of the torsional oscillations and/or the pendulum oscillations of the shaft. The reference phase or frequency profile is in this case obtained from a reference signal which has a greater phase constancy. A signal derived from the mains voltage is particularly suitable.

In order to allow the actual torsion of the shaft, which varies over time, to be determined as exactly as possible, with this torsion being expressed in a discrepancy from a linear phase profile of the rotary movement with respect to time, a plurality of frequency bands of the detected measurement signals are preferably analyzed simultaneously. In the process, an attempt is made to determine whether the phase fluctuations in the various frequency bands are correlated with one another. For further assessment, only those from the set of detected phase fluctuations of the measurement signals are preferably used which are correlated.

In one advantageous procedure, limit values are predetermined for the phase or frequency fluctuations. If it is found that the detected measured values have exceeded the limit values, a signal is generated or the electrodynamic machine is shutdown. In particular, the limit values are in each case specified for each frequency band, that is to say for the rated rotor rotation frequency or its multiple, and are compared with the respective associated values of the phase fluctuation.

It has also been found that determined amplitude fluctuations can be assessed in a suitable manner as a measure for bending oscillations. In this case so to speak, a plurality of frequency bands of the detected measurement signal are preferably analyzed and, are investigated for correlated amplitude fluctuations, simultaneously. A value for the assessment of the rotor movement is particularly preferably determined exclusively on the basis of the correlated amplitude fluctuations.

In particular, a limit value is predetermined for the amplitude fluctuations, and if the limit value is exceeded, a signal is generated, or the electrodynamic machine is shutdown.

In a further preferred embodiment of the method, an inductive air-core coil is used as a sensor for the detection of the bending oscillations and a higher-frequency current or voltage signal is applied to it. In particular, this signal is at a frequency above 500 Hz. Impedance fluctuations of the inductive air-core coil are evaluated. Bending oscillations can be detected by measurement of the impedance fluctuations and/or the current or voltage fluctuations of the sensor coil which occur, for example, because of eddy current losses or inductance changes. This corresponds to the functional principle of an eddy-current sensor. In this case, it is particularly advantageous to combine a field sensor and vibration sensor in one sensor head.

In one particularly preferred embodiment of the method, the torsional, pendular and/or bending oscillations are detected which are initiated by transient processes, for example by suddenly occurring load changes or disturbances like surges in the mains. The transient process is expressed in a sudden change in the phase, frequency and/or amplitude behavior of the detected measurement signals, in particular in transient phase, frequency and/or amplitude modulations. The excited torsional, pendular and/or bending oscillations occur again with characteristic time constants after the transient excitation. The torsional oscillation or bending oscillation natural frequencies of the shaft can be deduced from the information obtained during the excitation state relating to the phase, frequency and/or amplitude fluctuation. However, in particular, transient phase modulations, which occur at harmonics of the rated rotor rotation frequency, indicated torsional oscillations of the shaft.

The method according to the invention is used in particular for continuous monitoring of an electrodynamic machine.

FIG. 1 shows a schematic section through a generator arrangement 1 in order to illustrate details relating to magnetic field production. The rotor 11 is arranged within the stator 12, mounted along a rotation axis 14 on a shaft 10 such that it can rotate. The rotor 11 has rotor windings 16, through which current is passed, and which run in slots 15 and produce the main magnetic field 2. The profile of the magnetic field lines of force of the main field 2 is indicated by arrows within the rotor 11, the air gap 17 and by the dashed lines in the stator area 12. In addition to the main field 2, whose lines of force emerge essentially at right angles to the rotor surface, a stray air-gap field 3 is formed in the air gap 17, with tangential and radial field components with respect to the rotor surface, and this field is measured by one or more so-called air-gap sensors 18. Until now, the air-gap sensor 18 has been used exclusively for detection of rotor turn shorts, which are shown by a considerable change in the amplitude of the measured stray field 3 at a specific annular position of the rotor arrangement.

The method according to the solution provides a more extensive analysis of the output signal from the air-gap sensor 18.

The output signal from the air-gap sensor 18, which is produced by the stray field 3, changes during the rotation of the rotor arrangement, comprising the rotor 11 and the shaft 10, with each slot 15 in the rotor 11 typically producing a signal change which can be located, for example in the form of a sinusoidal signal peak.

The output signal from the air-gap sensor 18 is in consequence a periodic alternating signal with pronounced harmonics of the rated rotor rotation frequency. In particular, the output signal has a harmonic in the region of the number of slots N, that is to say a spectral component at N-times the rated rotor rotation frequency.

Torsional movements and rotary fluctuations of the rotor 11, and therefore of the shaft 10, are evident in fluctuations of the phase angle of this signal and in fluctuations of the phase angles of the individual harmonics of this signal, a phenomenon which is equivalent to phase or frequency modulation.

In order to determine torsional movements, that is to say torsional oscillations or pendulum oscillations, the output signals from the air-gap sensor 18 are therefore demodulated, in order to separate the phase change which can be expected as a result of the rated rotary movement of the rotor arrangement from the phase fluctuations resulting from torsional movements.

In this case, the output signal is preferably investigated simultaneously in different frequency ranges, in particular at the harmonics of the rated rotor rotation frequency. The output signal or a signal derived from it—which, for example, is generated by filtering and preamplification—is, for example, first of all split, in order to supply it in parallel to different demodulation stages. The individual spectral components of the output signal or of the signal derived from it are then demodulated in the various demodulation stages.

The rotor movement is signaled simultaneously in virtually all stray-field harmonics. The harmonics of the time function $s_k(t)$ of the stray field can therefore be formulated by the following relationship:

$$s_k(t) = C_k \cdot \cos(k\omega t + \Phi_k + \Delta\Phi_k)$$

In the ideal case, the individual phase fluctuation angles $\Delta\Phi_i$ are related to one another as follows:

$$\Delta\Phi_i / \Delta\Phi_j = i/j.$$

where:
 i, j, k order numbers of the harmonics,
 $\omega$ rated rotor rotation frequency
 $s_k(t)$ time function of the k-th harmonics
 $C_k$ amplitude of the k-th harmonics
 $\Phi_k$ phase offset of the k-th harmonics
 $\Delta\Phi_k$ phase fluctuation, which varies over time, of the k-th harmonics.

Those simultaneously detected phase fluctuation angles from the set of simultaneously detected phase fluctuation angles are selected by suitable filtering which are correlated with one another or are highly correlated with the rotor movement (and therefore with the shaft movement) in order to determine from them the actual rotor movement and therefore the actual torsional movement. Harmonics whose phase fluctuations are not highly correlated with the rotor movements, such as the harmonics at the fundamental mains frequency, are in contrast masked out of the calculation. In contrast to analysis of a single spectral component, this ensures that the measurement result is more resistant to disturbances.

Bending oscillations along the shaft lead to a variation in the distance between the rotor 11 and the air-gap sensor 18, as a result of which the amplitude of the output signal from the air-gap signal 18 changes. The amplitude and the frequency of the bending oscillations can be deduced in a corresponding manner, by amplitude demodulation methods.

The method steps described in the exemplary embodiment can also be used analogously in a method which detects the magnetic field by means of sensors arranged in the laminated stator core, so a change in the magnetic field which is dependent on the rotation angle can also be evaluated in this case.

While the invention has been particularly shown and described with reference to preferred embodiments thereof, it will be understood by those skilled in the art that various changes in form and details may be made therein without departing from the spirit and scope of the invention.

Figure 2:
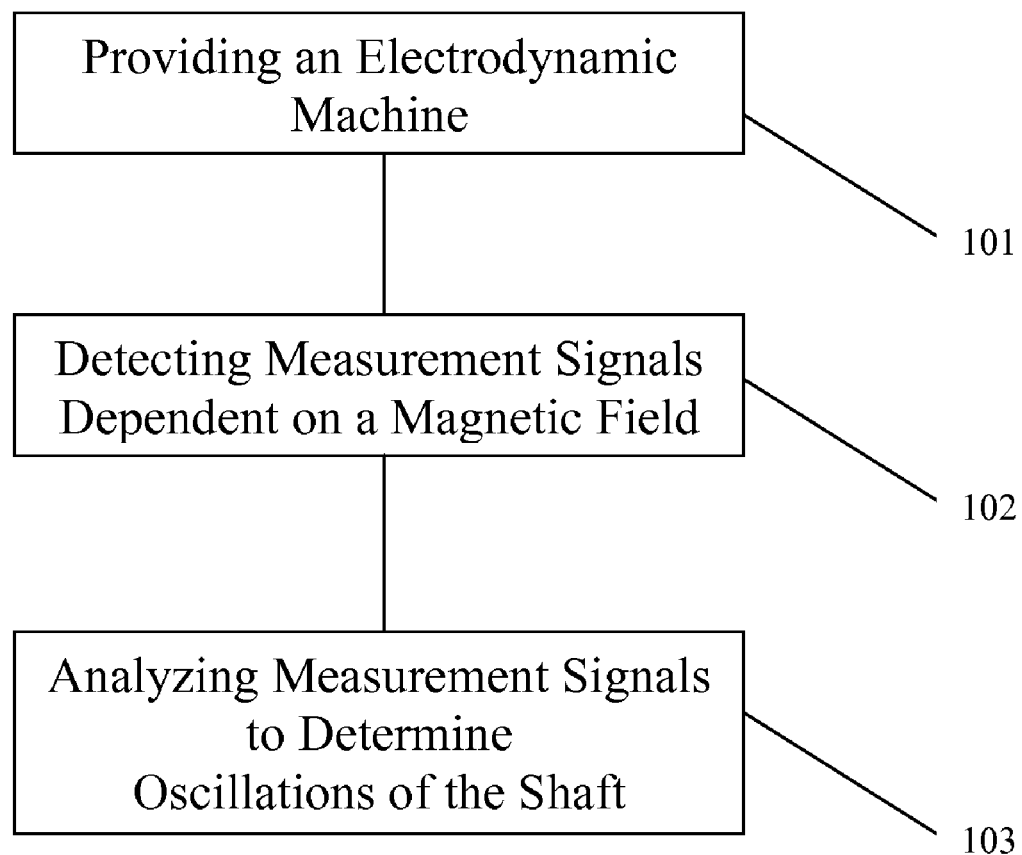
FIG. 2 schematically shows a method in accordance with an embodiment of the invention.

FIG. 2 schematically shows a method in accordance with an embodiment of the present invention for monitoring an electrodynamic machine. The method includes providing an electrodynamic machine at 101, the electrodynamic machine including a stator, a rotor arrangement mounted along a rotatable shaft and disposed so as to form an air gap between the rotor arrangement and the stator, and a sensor disposed in the air gap or within the sensor. Measurement signals dependent on a magnetic field produced by the electrodynamic machine are detected at 102. The measurements signals are analyzed at 103 to determine oscillations of the shaft.

LIST OF REFERENCE SYMBOLS

1 Generator
2 Main field
3 Air-gap field
4 Stray field
5 Foundation
10 Shaft
11 Rotor
12 Stator
13 Housing
14 Rotor rotation axis
15 Slot
16 Rotor windings
17 Air gap
18 Air-gap sensor

What is claimed is:

1. A method for monitoring an electrodynamic machine comprising:
   providing an electrodynamic machine including:
      a stator,
      a rotor arrangement mounted along a rotatable shaft, the rotor arrangement being disposed within the stator and forming an air gap between the rotor arrangement and the stator, and
      at least one sensor disposed in at least one of the air gap and the stator;
   detecting measurement signals using the at least one sensor that are dependent on a magnetic field produced by the electrodynamic machine;
   analyzing the measurement signals so as to determine oscillations of the shaft, wherein the oscillations of the shaft comprises at least one of torsional oscillations and pendulum oscillations.

2. The method as recited in claim 1, wherein the oscillations of the shaft include bending oscillations.

3. The method as recited in claim 2, further comprising evaluating at least one of the measurement signals and derived signals from the measurement signals so as to determine natural frequencies of the oscillations of the shaft.

4. The method as recited in claim 1, further comprising detecting rotor turn shorts using the at least one sensor.

5. The method as recited in claim 1, wherein the at least one sensor includes at least one of a coil, a conductor loop, a Hall sensor and a magnetoresistive measurement sensor.

6. The method as recited in claim 1, further comprising analyzing the detected measurement signals in at least one of a time domain and a frequency domain, and analyzing at least one of the phase, frequency and amplitude behavior of the detected measurement signals at least one of a rated rotor rotation frequency and a multiple of the rated rotor rotation frequency.

7. The method as recited in claim 1, further comprising investigating the detected measurement signals for the inclusion of at least one of frequency modulations and amplitude modulations.

8. The method as recited in claim 6, further comprising sampling the detected measurement signals at a sampling rate corresponding to a rated rotor rotation frequency or an integer multiple of the rated rotor rotation frequency.

9. The method as recited in claim 6, further comprising determining phase or frequency fluctuations of the detected measurement signals at at least one of the rated rotor rotation frequency and the multiple of the rated rotor rotation frequency,
   assessing the rotor rotational movement at the rated rotor rotation frequency based on the phase or frequency fluctuations, and
   wherein the phase or frequency fluctuations provide a measure for at least one of torsional oscillations of the shaft and pendulum oscillations of the shaft.

10. The method as recited in claim 6, further comprising simultaneously analyzing a plurality of frequency bands of the detected measurement signals and investigating the presence of correlated phase fluctuations.

11. The method as recited in claim 10, further comprising determining a value for an assessment of rotor movement based exclusively on correlated phase fluctuations.

12. The method as recited in claim 6, further comprising monitoring predetermined limit values of the phase or frequency fluctuations, and generating a signal or shutting down the electrodynamic machine if the limit values are exceeded.

13. The method as recited in claim 6 further comprising determining amplitude fluctuations and assessing the amplitude fluctuations as a measure for bending oscillations.

14. The method as recited in claim 6, further comprising simultaneously analyzing a plurality of frequency bands of the detected measurement signals, and investigating the plurality of frequency bands for correlated amplitude fluctuations.

15. The method as recited in claim 14, further comprising determining a value for assessment of the rotor movement based exclusively on the correlated amplitude fluctuations.

16. The method as recited in claim 13, further comprising monitoring a predetermined limit value of the amplitude fluctuations, and generating a signal or shutting down the electrodynamic machine if the limit value is exceeded.

17. The method as recited in claim 13, wherein the at least one sensor includes an inductive air-core coil for detecting bending oscillations, and further comprising applying a higher-frequency current or a voltage signal to the inductive air-core coil, and evaluating impedance changes of the inductive air-core coil.

18. The method as recited in claim 6, wherein at least one of torsional, pendular and bending oscillations of the shaft are initiated by transient processes, and wherein at least one of the transient phase modulations, frequency modulations and amplitude modulations occurs in a spectrum of the detected measurement signals or a spectrum of demodulated signals.

19. The method as recited in claim 18, further comprising assessing transient phase modulations of the harmonics of the rated rotor rotation frequency as an indication of torsional oscillations.

20. The method as recited in claim 18, further comprising evaluating at least one of a part of the spectrum of detected measurement signals and a part of the spectrum of demodulated signals containing the at least one of transient phase modulations, frequency modulations and amplitude modulations so as to determine natural frequencies of the oscillations of the shaft.

21. A method for monitoring an electrodynamic machine comprising:
   providing an electrodynamic machine including:
      a stator,
      a rotor arrangement mounted along a rotatable shaft, the rotor arrangement being disposed within the stator and forming an air gap between the rotor arrangement and the stator, and
      at least one sensor disposed in at least one of the air gap and the stator;
   detecting measurement signals using the at least one sensor that are dependent on a magnetic field produced by the electrodynamic machine;
   analyzing the measurement signals so as to determine oscillations of the shaft;
   analyzing the measurement signals in at least one of a time domain and a frequency domain, and analyzing at least one of the phase, frequency and amplitude behavior of the detected measurement signals at at least one of a rated rotor rotation frequency and a multiple of the rated rotor rotation frequency;
   determining phase or frequency fluctuations of the detected measurement signals at at least one of the rated rotor rotation frequency and the multiple of the rated rotor rotation frequency; and
   assessing the rotor rotational movement at the rated rotor rotation frequency based on the phase or frequency fluctuations,
   wherein the phase or frequency fluctuations provide a measure for at least one of torsional oscillations of the shaft and pendulum oscillations of the shaft.

* * * * *